United States Patent
Hirose et al.

(10) Patent No.: US 10,847,462 B2
(45) Date of Patent: Nov. 24, 2020

(54) SEMICONDUCTOR INTEGRATED CIRCUIT DEVICE

(71) Applicant: SOCIONEXT INC., Yokohama (JP)

(72) Inventors: Masanobu Hirose, Yokohama (JP); Toshihiro Nakamura, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 139 days.

(21) Appl. No.: 16/138,868

(22) Filed: Sep. 21, 2018

(65) Prior Publication Data

US 2019/0051601 A1    Feb. 14, 2019

Related U.S. Application Data

(63) Continuation of application No. PCT/JP2017/004580, filed on Feb. 8, 2017.

(30) Foreign Application Priority Data

Mar. 28, 2016  (JP) .................................. 2016-063758

(51) Int. Cl.
    H01L 23/528    (2006.01)
    H01L 27/02     (2006.01)
    H01L 23/50     (2006.01)

(52) U.S. Cl.
    CPC .......... *H01L 23/5286* (2013.01); *H01L 23/50* (2013.01); *H01L 27/0248* (2013.01); *H01L 27/0292* (2013.01)

(58) Field of Classification Search
    None
    See application file for complete search history.

(56) References Cited

U.S. PATENT DOCUMENTS

| | | | |
|---|---|---|---|
| 6,222,213 B1 | 4/2001 | Fujiwara | |
| 2008/0042284 A1* | 2/2008 | Naruse | H01L 27/0207 257/758 |
| 2015/0340321 A1* | 11/2015 | Motomura | G06F 1/3287 257/390 |
| 2016/0126942 A1* | 5/2016 | Narita | H03K 17/08104 361/56 |
| 2017/0352650 A1* | 12/2017 | Azmat | H01L 27/11807 |
| 2018/0166386 A1* | 6/2018 | Biswas | H01L 23/50 |
| 2019/0115337 A1* | 4/2019 | Matsui | H02H 9/046 |
| 2019/0131239 A1* | 5/2019 | Kirimura | H01L 29/785 |
| 2019/0355712 A1* | 11/2019 | Yoshida | H01L 27/0924 |

FOREIGN PATENT DOCUMENTS

JP        2000-21987 A      1/2000

OTHER PUBLICATIONS

International Search Report issued in International Application No. PCT/JP2017/004580 dated Apr. 25, 2017.

* cited by examiner

*Primary Examiner* — Alexander G Ghyka

(74) *Attorney, Agent, or Firm* — McDermott Will & Emery LLP

(57) ABSTRACT

Disclosed herein is a semiconductor integrated circuit device which can ensure sufficient power supply ability and ESD protection capability for an I/O cell without increasing the area of the semiconductor integrated circuit. In-row power supply interconnects (21a to 21d) provided in I/O cell rows (10A, 10B) are connected to a power supply interconnect (23) provided between the I/O cell rows (10A, 10B) via power supply interconnects (25a to 25d). The power supply interconnect (23) is thicker than the in-row power supply interconnects (21a to 21d).

8 Claims, 6 Drawing Sheets

SEMICONDUCTOR INTEGRATED CIRCUIT DEVICE

CROSS-REFERENCE TO RELATED APPLICATION

This is a continuation of International Application No. PCT/JP2017/004580 filed on Feb. 8, 2017, which claims priority to Japanese Patent Application No. 2016-063758 filed on Mar. 28, 2016. The entire disclosures of these applications are hereby incorporated by reference.

BACKGROUND

The present disclosure relates to a semiconductor integrated circuit device including a core region and an I/O region.

Semiconductor integrated circuits have been increasing in their scale, and number of input and output signals. Therefore, if input/output cells (I/O cells) are arranged in a single row to surround a core region, the area of the semiconductor integrated circuit is defined by the I/O cells. This is disadvantageous in some cases because it leads to an increase in the area of a device including the semiconductor integrated circuit, i.e., a semiconductor integrated circuit device.

Japanese Unexamined Patent Publication No. 2000-21987 discloses a semiconductor integrated circuit in which the I/O cells are arranged in multiple rows in a peripheral portion of the circuit. This arrangement avoids the area of the semiconductor integrated circuit from being defined by the I/O cells.

SUMMARY

In a semiconductor integrated circuit including the I/O cells arranged in multiple concentric rows as disclosed by Japanese Unexamined Patent Publication No. 2000-21987, each I/O cell row is provided with a ring-shaped power supply interconnect, to which power is supplied through an external connection pad. This configuration requires each I/O cell row to have sufficient power supply ability and electrostatic discharge (ESD) protection capability. This requirement can be met if the number of the I/O cells for power supply is increased in each I/O cell row. Unfortunately, this solution further increases the area of the semiconductor integrated circuit.

It is therefore an object of the present disclosure to provide a semiconductor integrated circuit device which can ensure sufficient power supply ability and ESD protection capability for an I/O cell, without increasing the area of a semiconductor integrated circuit.

According to an aspect of the present disclosure, a semiconductor integrated circuit device includes: a first I/O cell row and a second I/O cell row each including a plurality of I/O cells arranged side by side in a first direction, the first and second I/O cell rows being adjacent to each other in a second direction perpendicular to the first direction; a first in-row power supply interconnect and a second in-row power supply interconnect extending in the first direction in a first interconnect layer, and provided in a region of the first I/O cell row and a region of the second I/O cell row, respectively, each of the first and second in-row power supply interconnects supplying a predetermined power supply potential, and the first interconnect layer being composed of a single sublayer or two or more sublayers; a first power supply interconnect extending in the first direction in a second interconnect layer which is located above the first interconnect layer and thicker than the single sublayer or a thickest one of the two or more sublayers of the first interconnect layer, and provided in a region between the first and second I/O cell rows, the first power supply interconnect supplying the predetermined power supply potential; and a second power supply interconnect connecting the first power supply interconnect to at least one of the first in-row power supply interconnect or the second in-row power supply interconnect.

In this aspect, at least one of the first and second in-row power supply interconnects respectively provided in the first and second I/O cell rows is connected to the first power supply interconnect provided between the first and second I/O cell rows via the second power supply interconnect. This configuration with the first power supply interconnect further enhances the power supply ability and the ESD protection capability than the configuration with the in-row power supply interconnects only. In addition, since the first power supply interconnect is formed in an interconnect layer thicker than the in-row power supply interconnects, the power supply ability and the ESD protection capability are much more enhanced. Thus, the power supply ability and the ESD protection capability are enhanced without increasing the number of I/O cells, i.e., without increasing the area of the semiconductor integrated circuit. In addition, the number of the pads for the power supply can also be reduced.

According to another aspect of the present disclosure, a semiconductor integrated circuit device includes: at least one I/O cell row including a plurality of I/O cells arranged side by side in a first direction; an in-row power supply interconnect extending in the first direction in a first interconnect layer, and provided in a region of the at least one I/O cell row, the in-row power supply interconnect supplying a predetermined power supply potential, and the first interconnect layer being composed of a single sublayer or two or more sublayers; a plurality of pad rows provided in the region of the at least one I/O cell row and arranged in a second direction perpendicular to the first direction, each of the pad rows including a plurality of external connection pads arranged side by side in the first direction; a first power supply interconnect extending in the first direction in a second interconnect layer located above the first interconnect layer and thicker than the single layer or a thickest one of the two or more sublayers of the first interconnect layer, and provided between an adjacent pair of the pad rows in the region of the at least one I/O cell row, the first power supply interconnect supplying the predetermined power supply potential; and a second power supply interconnect connecting the first power supply interconnect to the in-row power supply interconnect.

In this aspect, the in-row power supply interconnect provided in the I/O cell row is connected to the first power supply interconnect provided between any one of adjacent pairs of the pad rows via the second power supply interconnect. This configuration with the first power supply interconnect further enhances the power supply ability and the ESD protection capability than the configuration with the in-row power supply interconnects only. In addition, since the first power supply interconnect is formed in an interconnect layer thicker than the in-row power supply interconnects, the power supply ability and the ESD protection capability are much more enhanced. Thus, the power supply ability and the ESD protection capability are enhanced without increasing the number of I/O cells, i.e., without increasing the area of the semiconductor integrated circuit. In addition, the number of the pads for the power supply can also be reduced.

According to another aspect of the present disclosure, a semiconductor integrated circuit device includes: at least one I/O cell row including a plurality of I/O cells arranged side by side in a first direction; an in-row power supply interconnect extending in the first direction in a first interconnect layer, and provided in a region of the at least one I/O cell row, the in-row power supply interconnect supplying a predetermined power supply potential, and the first interconnect layer being composed of a single sublayer or two or more sublayers; a plurality of pad rows provided in the region of the at least one I/O cell row and arranged side by side in a second direction perpendicular to the first direction, each of the pad rows including a plurality of external connection pads arranged side by side in the first direction; a first power supply interconnect extending in the first direction in a second interconnect layer at at least one of sides in the second direction of the plurality of the pad rows in the region of the at least one I/O cell row, the first power supply interconnect supplying the predetermined power supply potential, and the second interconnect layer being located above the first interconnect layer and thicker than the at least one sublayer of the first interconnect layer; and a second power supply interconnect connecting the first power supply interconnect to the in-row power supply interconnect.

In this aspect, the in-row power supply interconnect provided in the I/O cell row is connected to the first power supply interconnect provided at at least one of the ends, in the second direction perpendicular to the direction in which the pad rows are arranged, of the pad rows via the second power supply interconnect. This configuration with the first power supply interconnect further enhances the power supply ability and the ESD protection capability than the configuration with the in-row power supply interconnects only. In addition, since the first power supply interconnect is formed in an interconnect layer thicker than the in-row power supply interconnects, the power supply ability and the ESD protection capability are much more enhanced. Thus, the power supply ability and the ESD protection capability are enhanced without increasing the number of I/O cells, i.e., without increasing the area of the semiconductor integrated circuit. In addition, the number of the pads for the power supply can also be reduced.

The semiconductor integrated circuit device according to the present disclosure can ensure sufficient power supply ability and ESD protection capability for an I/O cell row, without increasing the area of the semiconductor integrated circuit.

DETAILED DESCRIPTION

Embodiments will be described below in detail with reference to the drawings.

First Embodiment

Figure 1:
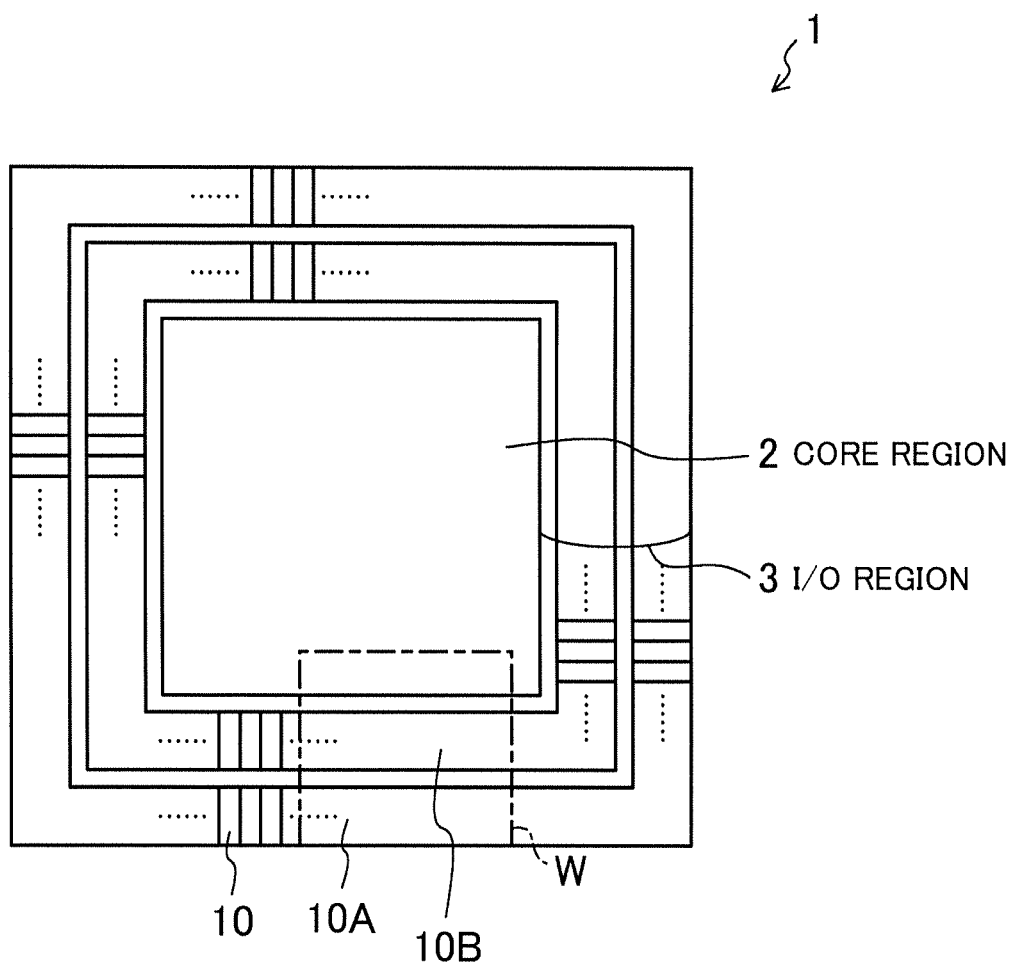
FIG. 1 is a plan view schematically illustrating a general configuration of a semiconductor integrated circuit device according to a first embodiment.

FIG. 1 is a plan view schematically illustrating a general configuration of a semiconductor integrated circuit device according to a first embodiment. A semiconductor integrated circuit device 1 shown in FIG. 1 includes a core region 2 in which an internal core circuit is formed, and an I/O region 3 which surrounds the core region 2 and in which an interface circuit (i.e., an I/O circuit) is formed. In the I/O region 3, two I/O cell rows 10A and 10B, each of which is in an annular shape, are arranged along the periphery of the semiconductor integrated circuit device 1. Although not illustrated in detail in FIG. 1, a plurality of I/O cells 10 forming the interface circuit are arranged in each of the I/O cell rows 10A and 10B. The semiconductor integrated circuit device 1 also includes a plurality of external connection pads (not shown in FIG. 1) arranged therein.

Figure 2:
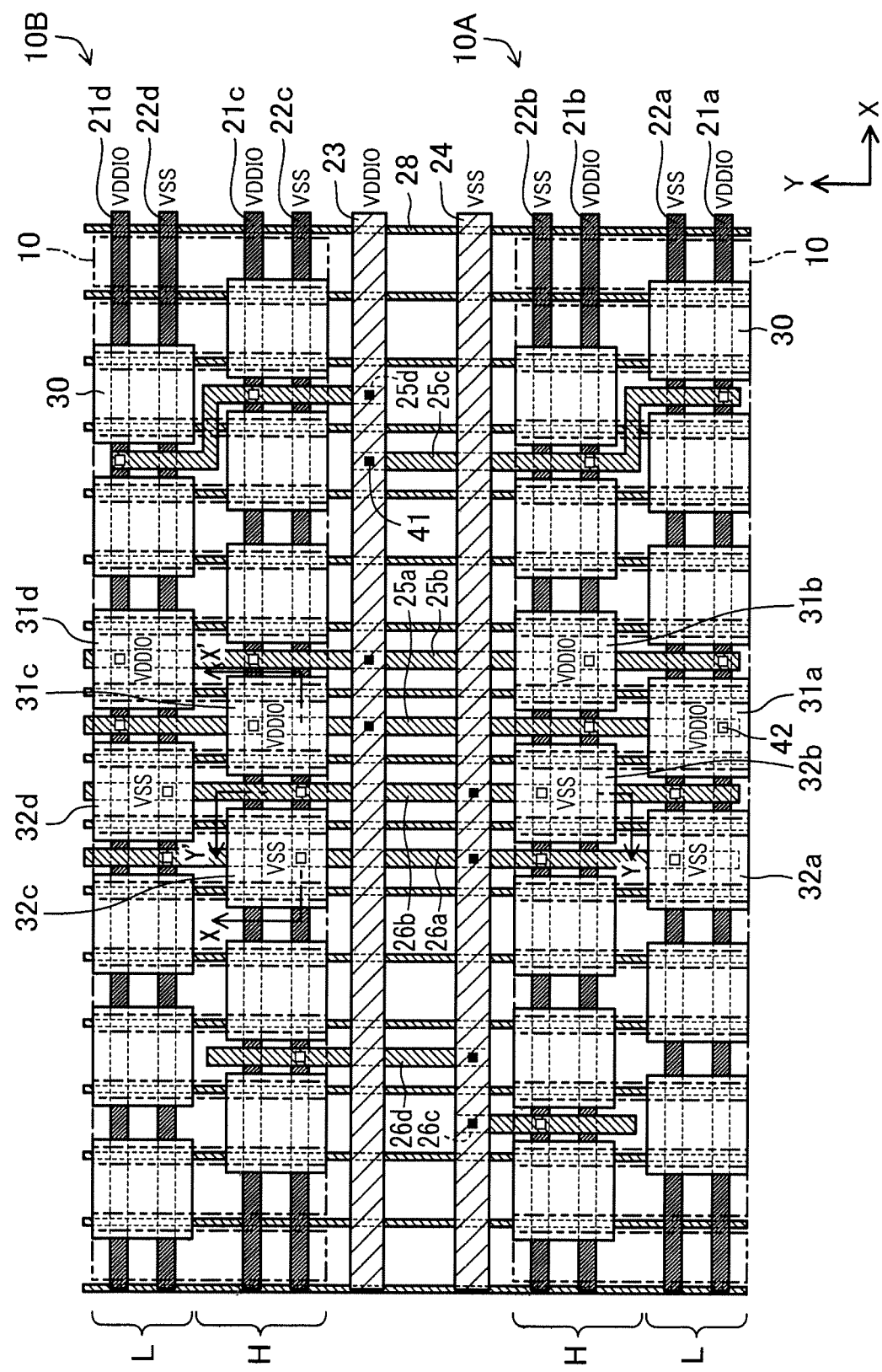
FIG. 2 is a plan view illustrating an exemplary configuration of an I/O region of the semiconductor integrated circuit device according to the first embodiment.
Figure 3:
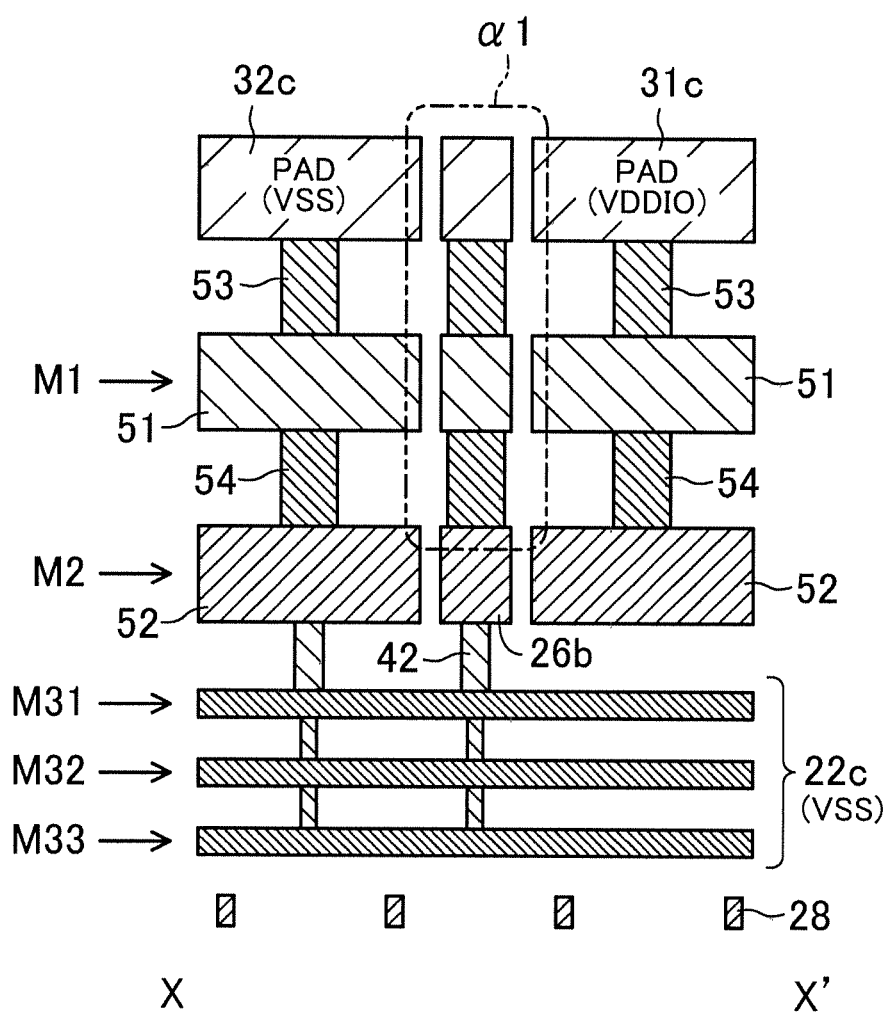
FIG. 3 is a cross-sectional view illustrating the exemplary configuration of FIG. 2.
Figure 4:
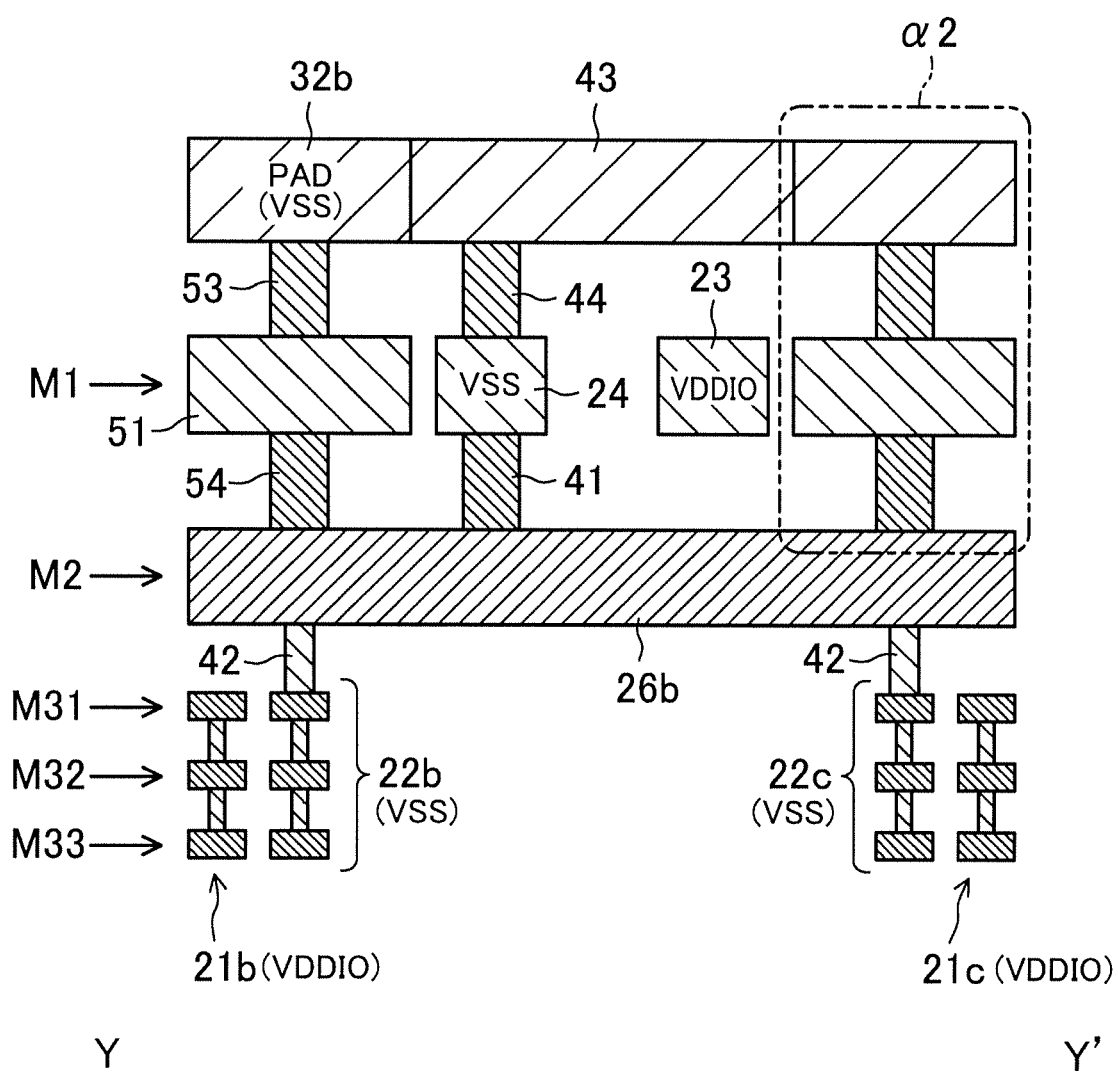
FIG. 4 is a cross-sectional view illustrating the exemplary configuration of FIG. 2.

FIG. 2 is a plan view illustrating an exemplary configuration of the I/O region 3 of the semiconductor integrated circuit device 1 according to this embodiment, particularly showing a portion W in FIG. 1 in an enlarged scale. Note that FIG. 2 does not show an internal configuration of each I/O cell, signal interconnects, or other elements. FIG. 3 is a schematic cross-sectional view taken along line X-X' of FIG. 2, and FIG. 4 is a schematic cross-sectional view taken along line Y-Y' of FIG. 2.

In FIG. 2, each of the two I/O cell rows 10A and 10B includes a plurality of I/O cells 10 (depicted by chain double-dashed lines) arranged side by side in an X direction corresponding to a first direction, i.e., a horizontal direction in FIG. 2 along an external side of the semiconductor integrated circuit device 1. The I/O cell rows 10A and 10B are adjacent to each other in a Y direction corresponding to a second direction, i.e., a vertical direction in FIG. 2 perpendicular to the first direction. The I/O cells 10 include I/O cells for supplying a power supply potential and a ground potential, and I/O cells for signal transmission.

A plurality of external connection pads 30 (will be hereinafter simply referred to as "pads") are arranged in regions of the I/O cell rows 10A and 10B. The pads 30 are arranged side by side in the X direction in an upper layer of the I/O cells 10, and are arranged in two rows in a staggered pattern in each of the I/O cell rows 10A and 10B. That is, four rows in total are formed in the I/O cell rows 10A and 10B. An interval between the second and third rows of the pads 30 is larger than an interval between the pad rows in each of the regions of the I/O cell rows 10A and 10B. The pads 30 include pads 31a, 31b, 31c, and 31d (indicated by "VDDIO" in FIG. 2) to which a power supply potential VDDIO is supplied, and pads 32a, 32b, 32c, and 32d (indicated by "VSS" in FIG. 2) to which a ground potential VSS is supplied. The VDDIO is, for example, 3.3V. The other pads 30 are mainly for the signal transmission. The pads 31a, 31b, 32a, and 32b, serving as first pads, are arranged on the I/O cell row 10A, while the pads 31c, 31d, 32c, and 32d, serving as second pads, are arranged on the I/O cell row 10B.

Each pad 30 is connected to the outside of the semiconductor integrated circuit device 1 via, for example, a bonding wire, or a bump. Each pad 30 is arranged in an upper layer of an associated one of the I/O cells 10, and connected to the associated one of the I/O cells 10. Note that the positional relationship between the pad 30 and the corresponding I/O cell 10 is not limited to this example.

In the regions of the I/O cell rows 10A and 10B, in-row power supply interconnects 21a, 21b, 21c, and 21d for supplying the VDDIO, and in-row power supply interconnects 22a, 22b, 22c, and 22d for supplying the VSS extend in the X direction. The in-row power supply interconnects 21a, 21b, 22a, and 22b, serving as first in-row power supply interconnects, are arranged in the region of the I/O cell row 10A, while the in-row power supply interconnects 21c, 21d, 22c, and 22d, serving as second in-row power supply interconnects, are arranged in the region of the I/O cell row 10B. The numbers and positions of the in-row power supply interconnects and the types of the potential to be supplied are not limited to those according to the configuration shown in FIG. 2.

A signal interconnect region 28 extending in the Y direction is provided between an adjacent pair of the I/O cells 10. Signal interconnects can be disposed in the signal interconnect regions 28. That is, each of the signal interconnects extending in the Y direction can pass between an adjacent pair of the I/O cells 10. Alternatively, the I/O cells 10 may be arranged with no clearance therebetween. In this case, the signal interconnects may pass through the I/O cells 10. FIG. 2 illustrates the I/O cells 10 of the same size and shape, but they may have different size and shape.

As shown in FIGS. 3 and 4, thick interconnect layers M1 and M2 are provided below the pads 30 (pads 31c, 32b, and 32c). Thick interconnects 51 and 52 are respectively provided in the interconnect layers M1 and M2 below the pads 30 for relieving damage caused by bonding, for example. The pads 30 and the thick interconnect 51 are connected together through vias 53, and the thick interconnects 51 and 52 are connected together through vias 54. The in-row power supply interconnects 21a to 21d and 22a to 22d are provided in three interconnect layers M31, M32, and M33 stacked one after another as a first interconnect layer below the interconnect layer M2. Here, the first interconnect layer is composed of three sublayers M31, M32, M33. The first interconnect layer may be composed of a single sublayer or two or more sublayers. The interconnect layers M1 and M2 are thicker than the interconnect layers M31, M32, and M33.

Back to FIG. 2, power supply interconnects 23 and 24, serving as first power supply interconnects, extend in the X direction in a region between the I/O cell rows 10A and 10B. The power supply interconnect 23 supplies the VDDIO, and the power supply interconnect 24 supplies the VSS. Further, power supply interconnects 25a, 25b, 25c, 25d, 26a, 26b, 26c, and 26d, serving as second power supply interconnects, extend substantially in the Y direction.

The power supply interconnects 25a and 25b extend linearly in the Y direction across the I/O cell rows 10A and 10B, and are connected to the power supply interconnect 23 between the I/O cell rows 10A and 10B, and also to the in-row power supply interconnects 21a and 21b in the I/O cell row 10A and the in-row power supply interconnects 21c and 21d in the I/O cell row 10B. The power supply interconnects 26a and 26b extend linearly in the Y direction across the I/O cell rows 10A and 10B, and are connected to the power supply interconnect 24 between the I/O cell rows 10A and 10B, and also to the in-row power supply interconnects 22a and 22b in the I/O cell row 10A, and the in-row power supply interconnects 22c and 22d in the I/O cell row 10B.

The power supply interconnect 25a is connected to the pads 31a and 31c. The pads 31a and 31c are arranged to oppose to each other in the Y direction, and overlap with the power supply interconnect 25a when viewed in plan. The power supply interconnect 25b is connected to the pads 31b and 31d. The pads 31b and 31d are arranged to oppose to each other in the Y direction, and overlap with the power supply interconnect 25b when viewed in plan. The power supply interconnect 26a is connected to the pads 32a and 32c. The pads 32a and 32c are arranged to oppose to each other in the Y direction, and overlap with the power supply interconnect 26a when viewed in plan. The power supply interconnect 26b is connected to the pads 32b and 32d. The pads 32b and 32d are arranged to oppose to each other in the Y direction, and overlap with the power supply interconnect 26b when viewed in plan. The pads arranged in this manner can be efficiently connected to the power supply interconnects in a short distance.

The power supply interconnect 25c connects the power supply interconnect 23 between the I/O cell rows 10A and 10B to the in-row power supply interconnects 21a and 21b in the I/O cell row 10A. The power supply interconnect 25d connects the power supply interconnect 23 between the I/O cell rows 10A and 10B to the in-row power supply interconnects 21c and 21d in the I/O cell row 10B. The power supply interconnects 25c and 25d respectively have bends so that they do not overlap with the pads 30 when viewed in plan. The power supply interconnect 26c connects the power supply interconnect 24 between the I/O cell rows 10A and 10B to the in-row power supply interconnect 22b in the I/O cell row 10A. The power supply interconnect 26d connects the power supply interconnect 24 between the I/O cell rows 10A and 10B to the in-row power supply interconnect 22c in the I/O cell row 10B.

As shown in FIGS. 3 and 4, the power supply interconnects 23 and 24 between the I/O cell rows 10A and 10B are formed in the thick interconnect layer M1. The power supply interconnect 26b and other interconnects extending substantially in the Y direction are formed in the thick interconnect layer M2. The power supply interconnects 23 and 24 are connected to the power supply interconnect 26b and other interconnects formed in the interconnect layer M2 through vias 41. The in-row power supply interconnects 22b, 22c and other interconnects are connected to the power supply interconnect 26b and other interconnects formed in the interconnect layer M2 through vias 42. As shown in FIG. 4, an interconnect 43 extending in the Y direction across the I/O cell rows 10A and 10B may be formed in the layer in which the pads 30 are formed. The interconnect 43 is connected to the power supply interconnect 24 for supplying the VSS through a via 44.

Note that the cross sectional configurations shown in FIGS. 3 and 4 are merely examples, and the present embodiment is not limited thereto. For example, the in-row power supply interconnects are not limited to have the three layers, and may have a single layer, or multiple layers more or less than three. Likewise, at least one additional interconnect layer may be formed between the interconnect layers M1 and M2. In such a case, the power supply interconnects 23 and 24 may be connected to the power supply interconnect 26a and other interconnects formed in the interconnect layer M2 through a combination of short interconnects and vias formed in the interconnect layers between them. Likewise, one or more additional interconnect layer may be formed between the interconnect layer M2 and the layer in which the in-row power supply interconnects are formed. In such a case, the in-row power supply interconnects may be connected to the power supply interconnect 26a and other interconnects formed in the interconnect layer M2 through a combination of short interconnects and vias formed in the interconnect layers between them. Alternatively, as indicated by α1 in FIG. 3 and α2 in FIG. 4, the power supply interconnect 26b and other interconnects may have, between the pads 30, for example, a multilayer portion including the interconnect layer M1 and the layer forming the pads 30. This configuration can reduce the impedance of the power supply interconnect 26b and other interconnects. The configuration indicated by α1 in FIG. 3 and α2 in FIG. 4 may be omitted.

The configuration shown in FIG. 2 has the following additional features. A typical I/O cell has a high power supply voltage region including an ESD circuit and an output buffer for outputting a signal to a device outside the semiconductor integrated circuit device, and a low power supply voltage region including a circuit for inputting and outputting a signal to and from the semiconductor integrated circuit device. Each of the I/O cells 10 in FIG. 2 includes a high power supply voltage region (indicated by "H" in FIG. 2) and a low power supply voltage region (indicated by "L" in FIG. 2) arranged side by side in the Y direction. In general, the I/O cells are arranged such that their high power supply voltage regions, which are mainly used for inputting and outputting signals to and from an external device, are located toward the outside in the semiconductor integrated circuit device 1, and their low power supply voltage regions, which are mainly used for inputting and outputting signals to and from the internal core region, are located toward the inside in the semiconductor integrated circuit device 1. By contrast, in the configuration of FIG. 2, the I/O cell row 10A is arranged such that its high power supply voltage regions are located toward the inside in the semiconductor integrated circuit device 1, and its low power supply voltage regions are located toward the outside in the semiconductor integrated circuit device 1. Specifically, the I/O cell rows 10A and 10B are both arranged such that their low power supply voltage regions are located closer to the power supply interconnects 23 and 24.

Advantages

In the configuration shown in FIGS. 2 to 4, the interconnects for supplying the VDDIO, namely, the in-row power supply interconnects 21a and 21b in the I/O cell row 10A and the in-row power supply interconnects 21c and 21d in the I/O cell row 10B, are connected together via the power supply interconnect 23 between the I/O cell rows 10A and 10B and the power supply interconnects 25a to 25d. This configuration with the power supply interconnect 23 further enhances the power supply ability and the ESD protection capability than the configuration with the in-row power supply interconnects 21a to 21d only. Further, the interconnects for supplying VSS, namely, the in-row power supply interconnects 22a and 22b in the I/O cell row 10A and the in-row power supply interconnects 22c and 22d in the I/O cell row 10B, are connected together via the power supply interconnect 24 between the I/O cell rows 10A and 10B and the power supply interconnects 26a to 26d. This configuration with the power supply interconnect 24 further enhances the power supply ability and the ESD protection capability than the configuration with the in-row power supply interconnects 22a to 22d only.

Moreover, the power supply interconnects 23 and 24 are formed in the thick interconnect layer M1, and therefore, thicker than the in-row power supply interconnects 21a to 21d and 22a to 22d formed in the interconnect layers M31 to M33. This can further enhance the power supply ability and the ESD protection capability. Thus, the power supply ability and the ESD protection capability can be enhanced without increasing the number of I/O cells 10 for the power supply in the I/O cell rows 10A and 10B, i.e., without increasing the area of the semiconductor integrated circuit. In addition, the number of the pads 30 for the power supply can also be reduced.

Further, the in-row power supply interconnects 21a and 21b in the I/O cell row 10A are connected to the in-row power supply interconnects 21c and 21d in the I/O cell row 10B via the power supply interconnect 23 and the power supply interconnects 25a to 25d. Likewise, the in-row power supply interconnects 22a and 22b in the I/O cell row 10A are connected to the in-row power supply interconnects 22c and 22d in the I/O cell row 10B via the power supply interconnect 24 and the power supply interconnects 26a to 26d. Thus, each of the I/O cell rows 10A and 10B can receive power supplied from the other I/O cell row, or make use of the ESD protection capability of the other I/O cell row.

Further, the I/O cell rows 10A and 10B are both arranged such that their high power supply voltage regions are located closer to the power supply interconnects 23 and 24. With the high power supply voltage regions arranged closer to the power supply interconnects 23 and 24, a distance from each of the power supply interconnects 23 and 24 to the ESD circuit and output buffer of each high power supply voltage region can be shortened. This can more effectively reduce the power supply voltage drop and improve the resistance to ESD.

Another Exemplary Configuration

In the device shown in FIG. 2, the in-row power supply interconnects of both of the I/O cell rows 10A and 10B have been connected to the power supply interconnects between the I/O cell rows 10A and 10B. Alternatively, the in-row power supply interconnects of either one of the I/O cell rows 10A and 10B may be connected to the power supply interconnects between the I/O cell rows 10A and 10B.

Further, in the semiconductor integrated circuit device shown in FIG. 2, to which the power supply potential VDDIO and the ground potential VSS are supplied, the configuration of the present embodiment has been applied to the interconnects supplying the VDDIO and the interconnects supplying the VSS. However, this is not limiting. For example, the configuration of the present embodiment may be applied only to the interconnects supplying the VDDIO. Alternatively, in a semiconductor integrated circuit device to which different types of power supply potentials are supplied, the configuration of the present embodiment may be applied to some or all of the interconnects for supplying different types of power supply potentials and ground potentials.

Figure 5:
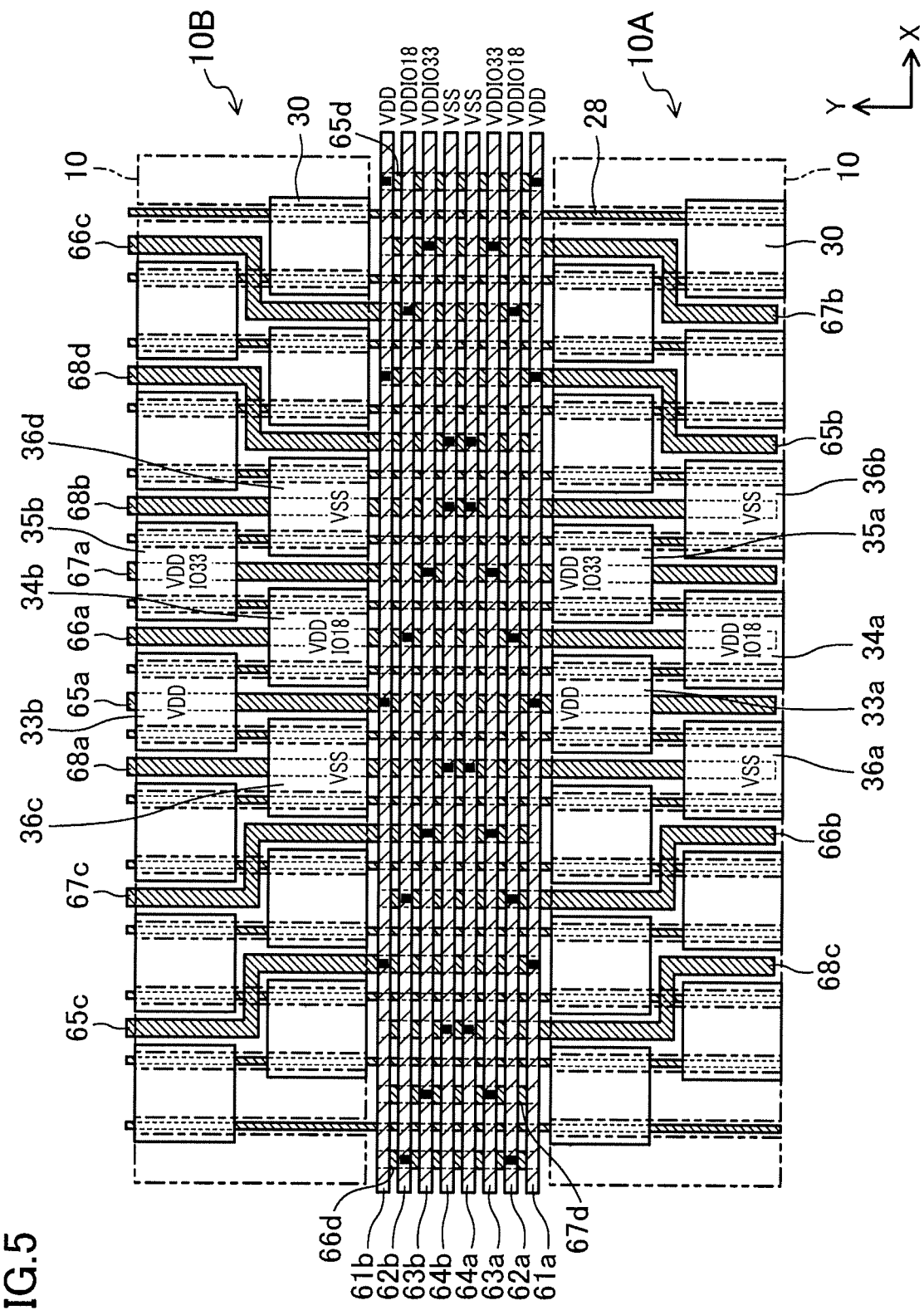
FIG. 5 illustrates another exemplary configuration of the I/O region of the semiconductor integrated circuit device according to the first embodiment.

FIG. 5 is a plan view illustrating another exemplary configuration of the I/O region 3 of the semiconductor integrated circuit device 1 to which different types of power supply potentials are supplied. In the exemplary configuration of FIG. 5, three types of power supply potentials, namely, VDD, VDDIO 18, and VDDIO 33 are supplied. For example, the VDD is 0.9V, the VDDIO 18 is 1.8 V, and the VDDIO 33 is 3.3V. Note that FIG. 5 does not show an internal configuration of each I/O cell, signal interconnects, or other elements. The in-row power supply interconnects are also omitted from FIG. 5 for simplification.

The pads 30 include pads 33a and 33b to which VDD is supplied (indicated by "VDD" in FIG. 5), pads 34a and 34b to which VDDIO 18 is supplied (indicated by "VDDIO18" in FIG. 5), pads 35a and 35b to which VDDIO 33 is supplied (indicated by "VDDIO33" in FIG. 5), and pads 36a, 36b, 36c, and 36d to which VSS is supplied (indicated by "VSS" in FIG. 5). The other pads 30 are mainly for the signal transmission. The pads 33a, 34a, 35a, 36a, and 36b, serving as first pads, are arranged on the I/O cell row 10A, while the pads 33b, 34b, 35b, 36c, and 36d, serving as second pads, are arranged on the I/O cell row 10B.

Power supply interconnects 61a, 61b, 62a, 62b, 63a, 63b, 64a, and 64b, serving as first power supply interconnects, extend in the X direction in a region between the I/O cell rows 10A and 10B. The power supply interconnects 61a and 61b supply the VDD. The power supply interconnects 62a and 62b supply the VDDIO 18. The power supply interconnects 63a and 63b supply the VDDIO 33. The power supply interconnects 64A and 64b supply the VSS. Further, power supply interconnects 65a, 65b, 65c, 66a, 66b, 66c, 67a, 67b, 67c, 68a, 68b, 68c, and 68d, serving as second power supply interconnects, extend substantially in the Y direction.

The power supply interconnect 65a extends linearly in the Y direction across the I/O cell rows 10A and 10B, and is connected to the power supply interconnects 61a and 61b for supplying the VDD between the I/O cell rows 10A and 10B, and also to the in-row power supply interconnects in the I/O cell row 10A, and the in-row power supply interconnects in the I/O cell row 10B. The power supply interconnect 65b connects the power supply interconnects 61a and 61b to the in-row power supply interconnects in the I/O cell row 10A. The power supply interconnect 65c connects the power supply interconnects 61a and 61b to the in-row power supply interconnects in the I/O cell row 10B. The power supply interconnects 65b and 65c respectively have bends so that they do not overlap with the pads 30 when viewed in plan.

The power supply interconnect 66a extends linearly in the Y direction across the I/O cell rows 10A and 10B, and is connected to the power supply interconnects 62a and 62b, between the I/O cell rows 10A and 10B, for supplying the VDDIO 18, and also to the in-row power supply interconnects in the I/O cell row 10A and the in-row power supply interconnects in the I/O cell row 10B. The power supply interconnect 66b connects the power supply interconnects 62a and 62b to the in-row power supply interconnects in the I/O cell row 10A. The power supply interconnect 66c connects the power supply interconnects 62a and 62b to the in-row power supply interconnects in the I/O cell row 10B. The power supply interconnects 66b and 66c respectively have bends so that they do not overlap with the pads 30 when viewed in plan.

The power supply interconnect 67a extends linearly in the Y direction across the I/O cell rows 10A and 10B, and is connected to the power supply interconnects 63a and 63b, between the I/O cell rows 10A and 10B, for supplying the VDDIO 33, and also to the in-row power supply interconnects in the I/O cell row 10A and the in-row power supply interconnects in the I/O cell row 10B. The power supply interconnect 67b connects the power supply interconnects 63a and 63b to the in-row power supply interconnects in the I/O cell row 10A. The power supply interconnect 67c connects the power supply interconnects 63a and 63b to the in-row power supply interconnects in the I/O cell row 10B. The power supply interconnects 67b and 67c respectively have bends so that they do not overlap with the pads 30 when viewed in plan.

The power supply interconnects 68a and 68b extend linearly in the Y direction across the I/O cell rows 10A and 10B, and are connected to the power supply interconnects 64a and 64b for supplying the VSS between the I/O cell rows 10A and 10B, and also to the in-row power supply interconnects in the I/O cell row 10A and the in-row power supply interconnects in the I/O cell row 10B. The power supply interconnect 68c connects the power supply interconnects 64a and 64b to the in-row power supply interconnects in the I/O cell row 10A. The power supply interconnect 68d connects the power supply interconnects 64a and 64b to the in-row power supply interconnects in the I/O cell row 10B. The power supply interconnects 68c and 68d respectively have bends so that they do not overlap with the pads 30 when viewed in plan.

The power supply interconnect 65a is connected to the pads 33a and 33b. The pads 33a and 33b are arranged to oppose to each other in the Y direction, and overlap with the power supply interconnect 65a when viewed in plan. The power supply interconnect 66a is connected to the pads 34a and 34b. The pads 34a and 34b are arranged to oppose to each other in the Y direction, and overlap with the power supply interconnect 66a when viewed in plan. The power supply interconnect 67a is connected to the pads 35a and 35b. The pads 35a and 35b are arranged to oppose to each other in the Y direction, and overlap with the power supply interconnect 67a when viewed in plan. The power supply interconnect 68a is connected to the pads 36a and 36c. The pads 36a and 36c are arranged to oppose to each other in the Y direction, and overlap with the power supply interconnect 68a when viewed in plan. The power supply interconnect 68b is connected to the pads 36b and 36d. The pads 36b and 36d are arranged to oppose to each other in the Y direction, and overlap with the power supply interconnect 68b when viewed in plan. The pads arranged in this manner can be efficiently connected to the power supply interconnects in a short distance.

Additionally, a power supply interconnect 65d connecting the power supply interconnects 61a and 61b together, a power supply interconnect 66d connecting the power supply interconnects 62a and 62b together, and a power supply interconnect 67d connecting the power supply interconnects 63a and 63b together extend in the Y direction.

The configuration of the interconnect layers of the device of FIG. 5 is the same as that of the device of FIG. 2. The device of FIG. 5 can obtain the same advantages as those of the device of FIG. 2. Specifically, the power supply ability and the ESD protection capability can be enhanced without increasing the area of the semiconductor integrated circuit.

In the devices of FIGS. 2 and 5, the two I/O cell rows 10A and 10B have been arranged. However, this is not limiting. For example, the configuration of the present embodiment may be applied to three or more I/O cell rows, or two or more of the three or more I/O cell rows.

The arrangements of the pads and power supply interconnects are not limited to those shown in FIGS. 2 and 5. For example, in the embodiments described above, the pads 30 have been arranged in two rows in a staggered pattern in each of the I/O cell rows 10A and 10B. However, the number of pad rows is not limited thereto, and the pads are not necessarily arranged in a staggered pattern. The interval between the pad rows is not limited to that shown in FIGS. 2 and 5. Further, in each of the I/O cell rows 10A and 10B, two pads receiving the VDDIO and two pads receiving the VSS have been arranged. However, this configuration is not limiting. For example, either one of the I/O cell rows 10A or 10B may have no pads receiving the VDDIO. The pads receiving the VDDIO and the pads receiving the VSS that have been opposed to each other are not necessarily opposed to each other. Furthermore, between the I/O cell rows 10A and 10B, the power supply interconnect 23 for supplying the VDD and the power supply interconnect 24 for supplying the VSS are provided one each in the device of FIG. 2, and two each in the device of FIG. 5. However, the number of the power supply interconnects is not limited thereto.

Second Embodiment

Figure 6:
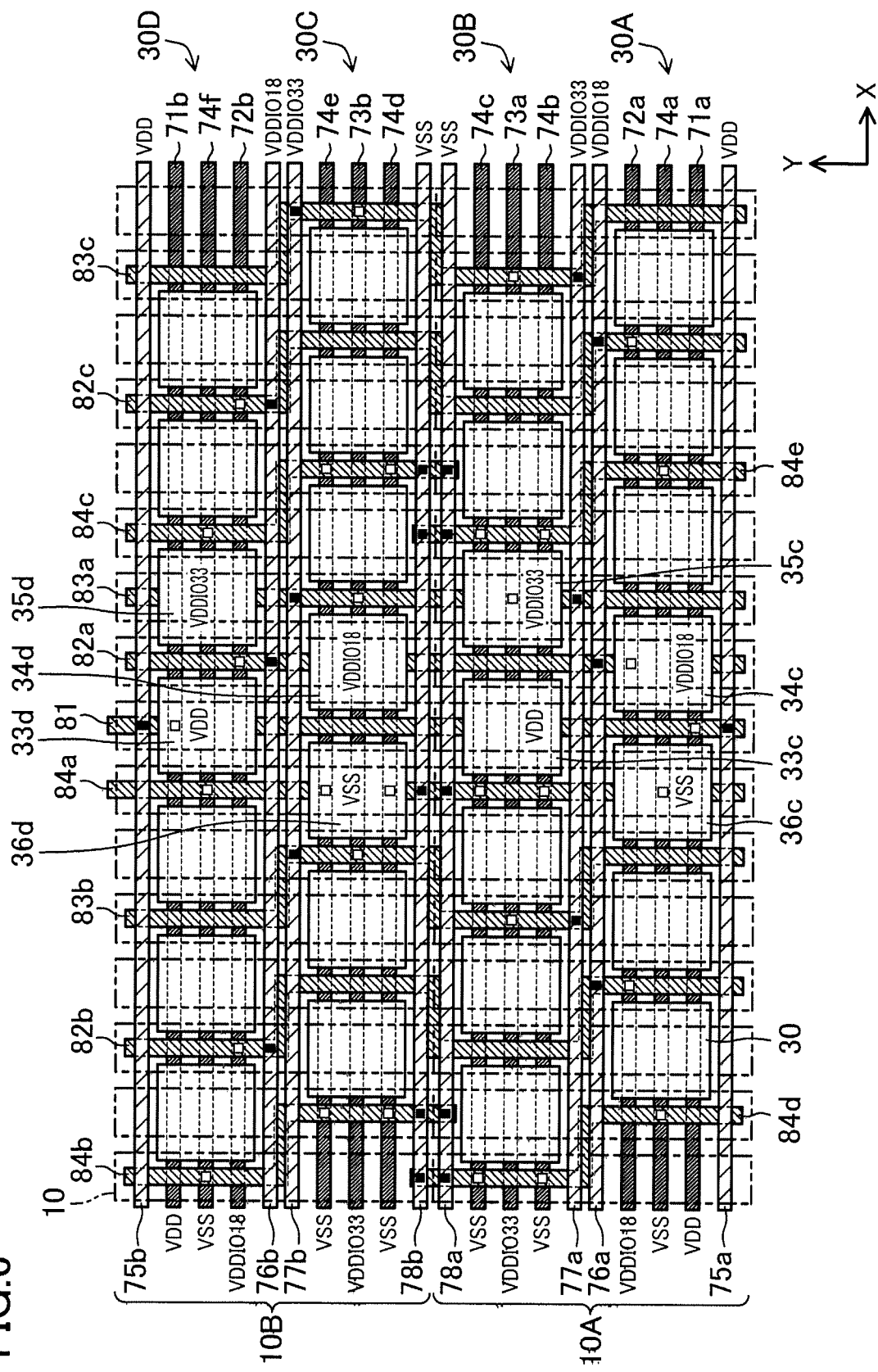
FIG. 6 illustrates an exemplary configuration of an I/O region of a semiconductor integrated circuit device according to a second embodiment.

FIG. 6 is a view illustrating an exemplary configuration of an I/O region 3 of a semiconductor integrated circuit device according to a second embodiment, particularly showing a portion W in FIG. 1 in an enlarged scale. In the exemplary configuration of FIG. 6, three types of power supply potentials, namely, VDD, VDDIO 18, and VDDIO 33 are supplied. For example, the VDD is 0.9V, the VDDIO 18 is 1.8 V, and the VDDIO 33 is 3.3V. Note that FIG. 6 does not show an internal configuration of each I/O cell, signal interconnects, or other elements.

FIG. 6 shows two I/O cell rows 10A and 10B, each of which includes a plurality of I/O cells 10 (depicted by chain double-dashed lines) arranged side by side in an X direction corresponding to a first direction, i.e., a horizontal direction in FIG. 6 along one external side of the semiconductor integrated circuit device 1. The I/O cell rows 10A and 10B are adjacent to each other in a Y direction corresponding to a second direction, i.e., a vertical direction in FIG. 2 perpendicular to the first direction. The I/O cells 10 include I/O cells for supplying a power supply potential and a ground potential, and I/O cells for signal transmission. In FIG. 6, the two I/O cell rows 10A and 10B are arranged with no gap left therebetween.

A plurality of pads 30 are arranged in the regions of the I/O cell rows 10A and 10B. The pads 30 are arranged side by side in the X direction in an upper layer of the I/O cells 10, and are arranged in two rows in a staggered pattern in each of the I/O cell rows 10A and 10B. That is, four pad rows 30A, 30B, 30C, and 30D are arranged in the regions of the I/O cell rows 10A and 10B. The pads 30 include pads 33c and 33d to which the VDD is supplied (indicated by "VDD" in FIG. 6), pads 34c and 34d to which the VDDIO 18 is supplied (indicated by "VDDIO18" in FIG. 6), pads 35c and 35c to which the VDDIO 33 is supplied (indicated by "VDDIO33" in FIG. 6), and pads 36c and 36d to which the VSS is supplied (indicated by "VSS" in FIG. 6). The other pads 30 are mainly for the signal transmission.

In the regions of the I/O cell rows 10A and 10B, in-row power supply interconnects 71a and 71b for supplying the VDD, in-row power supply interconnects 72a and 72b for supplying the VDDIO 18, in-row power supply interconnects 73a and 73b for supplying the VDDIO 33, and in-row power supply interconnects 74a, 74b, 74c, 74d, 74e, and 74f for supplying the VSS extend in the X direction. The in-row power supply interconnects 71a, 72a, and 74a are arranged in a layer below the pad row 30A in the region of the I/O cell row 10A. The in-row power supply interconnects 73a, 74b, and 74c are arranged in a layer below the pad row 30B in the region of the I/O cell row 10A. The in-row power supply interconnects 73a, 74d, and 74e are arranged in a layer below the pad row 30C in the region of the I/O cell row 10B. The in-row power supply interconnects 71b, 72b, and 74f are arranged in a layer below the pad row 30D in the region of the I/O cell row 10B. The numbers and positions of the in-row power supply interconnects and the types of the potential supplied by these interconnects are not limited to those according to the configuration shown in FIG. 6.

A signal interconnect extending in the Y direction can pass between an adjacent pair of the I/O cells 10. FIG. 6 illustrates the I/O cells 10 of the same size and shape, but they may have different size and shape.

A power supply interconnect 76a for supplying the VDDIO 18 and a power supply interconnect 77a for supplying the VDDIO 33, serving as first power supply interconnects, extend in the X direction in a region between the pad rows 30A and 30B. Power supply interconnects 78a and 78b for supplying the VSS, serving as the first power supply interconnects, extend in the X direction in a region between the pad rows 30B and 30C. A power supply interconnect 76b for supplying the VDDIO 18 and a power supply interconnect 77b for supplying the VDDIO 33, serving as the first power supply interconnects, extend in the X direction in a region between the pad rows 30C and 30D. In addition, a power supply interconnect 75a for supplying the VDD extends in the X direction below the pad row 30A in FIG. 6. A power supply interconnect 75b for supplying the VDD extends in the X direction above the pad row 30D in FIG. 6. Specifically, the power supply interconnects 75a and 75b for supplying the VDD, serving as the first power supply interconnects, are respectively provided at the sides in the Y direction of the pad rows 30A to 30D.

Further, power supply interconnects 81, 82a, 82b, 82c, 83a, 83b, 83c, 84a, 84b, 84c, 84d, and 84e, serving as second power supply interconnects, extend substantially in the Y direction. The power supply interconnect 81 extends linearly in the Y direction across the I/O cell rows 10A and 10B, and connects the power supply interconnects 75a and 75b for supplying the VDD respectively provided at the ends, in the Y direction, of the set of the pad rows 30A to 30D to the in-row power supply interconnect 71a in the I/O cell row 10A and the in-row power supply interconnect 71b in the I/O cell row 10B.

The power supply interconnect 82a extends linearly in the Y direction across the I/O cell rows 10A and 10B, and connects the power supply interconnects 76a and 76b for supplying the VDDIO 18 to the in-row power supply interconnect 72a in the I/O cell row 10A and the in-row power supply interconnect 72b in the I/O cell row 10B. The power supply interconnects 82b and 82c also connect the power supply interconnects 76a and 76b to the in-row power supply interconnects 72a and 72b. The power supply interconnects 82b and 82c respectively have bends so that they do not overlap with the pads 30 when viewed in plan.

The power supply interconnect 83a extends linearly in the Y direction across the I/O cell rows 10A and 10B, and connects the power supply interconnects 77a and 77b for supplying the VDDIO 33 to the in-row power supply interconnect 73a in the I/O cell row 10A and the in-row power supply interconnect 73b in the I/O cell row 10B. The power supply interconnects 83b and 83c also connect the power supply interconnects 77a and 77b to the in-row power supply interconnects 73a and 73b. The power supply interconnects 83b and 83c respectively have bends so that they do not overlap with the pads 30 when viewed in plan.

The power supply interconnect 84a extends linearly in the Y direction across the I/O cell rows 10A and 10B, and connects together the power supply interconnects 78a and 78b for supplying the VSS, the in-row power supply interconnects 74a, 74b, and 74c in the I/O cell row 10A, and the in-row power supply interconnect 74d, 74e, and 74f in the I/O cell row 10B. The power supply interconnects 84b and 84c connect the power supply interconnects 78a and 78b to the in-row power supply interconnects 74d, 74e, and 74f in the I/O cell row 10B. The power supply interconnects 84d and 84e connect the power supply interconnects 78a and 78b to the in-row power supply interconnects 74a, 74b, and 74c in the I/O cell row 10A. The power supply interconnects 84b, 84c, 84d, and 84e respectively have bends so that they do not overlap with the pads 30 when viewed in plan.

The power supply interconnect 81 is connected to the pads 33c and 33d. The pads 33c and 33d are arranged to oppose to each other in the Y direction, and overlap with the power supply interconnect 81 when viewed in plan. The power supply interconnect 82a is connected to the pads 34c and 34d. The pads 34c and 34d are arranged to oppose to each other in the Y direction, and overlap with the power supply interconnect 82a when viewed in plan. The power supply interconnect 83a is connected to the pads 35c and 35d. The pads 35c and 35d are arranged to oppose to each other in the Y direction, and overlap with the power supply interconnect 83a when viewed in plan. The power supply interconnect 84a is connected to the pads 36c and 36d. The pads 36c and 36d are arranged to oppose to each other in the Y direction, and overlap with the power supply interconnect 84a when viewed in plan. The pads arranged in this manner can be efficiently connected to the power supply interconnects in a short distance.

The configuration of the interconnect layers of the device of FIG. 6 is the same as that of the first embodiment shown in FIGS. 3 and 4. Specifically, the power supply interconnects 76a and other interconnects provided between the pad rows, and the power supply interconnects 75a and 75b provided at the ends, in the Y direction, of the set of the pad rows are formed in the interconnect layer M1, which is thicker than, and formed above, the interconnect layers M31, M32, and M33 in which the in-row power supply interconnects are formed. Further, the power supply interconnect 81 and other interconnects extending substantially in the Y direction are formed in the interconnect layer M2. As described in the first embodiment, this configuration of the interconnect layers is not limiting.

Advantages

In the device of FIG. 6, the interconnects for supplying the VDDIO 18, namely, the in-row power supply interconnects 72a and 72b in the I/O cell rows 10A and 10B, are connected to the power supply interconnect 76a between the pad rows 30A and 30B and the power supply interconnect 76b between the pad rows 30C and 30D via the power supply interconnects 82a to 82c. This configuration with the power supply interconnects 76a and 76b further enhances the power supply ability and the ESD protection capability than the configuration with the in-row power supply interconnects 72a and 72b only. Moreover, the interconnects for supplying the VDDIO 33, namely, the in-row power supply interconnects 73a and 73b in the I/O cell rows 10A and 10B, are connected to the power supply interconnect 77a between the pad rows 30A and 30B and the power supply interconnect 77b between the pad rows 30C and 30D via the power supply interconnects 83a to 83c. This configuration with the power supply interconnects 77a and 77b further enhances the power supply ability and the ESD protection capability than the configuration with the in-row power supply interconnects 73a and 73b only. Moreover, the interconnects for supplying the VSS, namely, the in-row power supply interconnects 74a to 74f in the I/O cell rows 10A and 10B, are connected to the power supply interconnects 78a and 78b between the pad rows 30B and 30C via the power supply interconnects 84a to 84e. This configuration with the power supply interconnects 78a and 78b further enhances the power supply ability and the ESD protection capability than the configuration with the in-row power supply interconnects 74a to 74f only. In addition, since the power supply interconnects 76a, 76b, 77a, 77b, 78a, and 78b are thicker than the in-row power supply interconnects 72a, 72b, 73a, 73b, and 74a to 74f, the power supply ability and the ESD protection capability are much more enhanced.

Further, in the device of FIG. 6, the interconnects for supplying the VDD, namely, the in-row power supply interconnects 71a and 71b in the I/O cell rows 10A and 10B, are connected to the power supply interconnects 75a and 75b provided at the ends, in the Y direction, of the set of the pad rows 30A to 30D via the power supply interconnect 81. This configuration with the power supply interconnects 75a and 75b further enhances the power supply ability and the ESD protection capability than the configuration including the in-row power supply interconnects 71a and 71b only. In addition, since the power supply interconnects 75a and 75b are thicker than the in-row power supply interconnects 71a and 71b, the power supply ability and the ESD protection capability are much more enhanced.

Thus, the power supply ability and the ESD protection capability are enhanced without increasing the number of I/O cells for the power supply in the I/O cell rows 10A and 10B, i.e., without increasing the area of the semiconductor integrated circuit. In addition, the number of the pads for the power supply can also be reduced.

Still Another Exemplary Configuration

The device of FIG. 6 is merely an example, and the arrangements of the pads, in-row power supply interconnects, and power supply interconnects between the pad rows are not limited to those shown in FIG. 6. For example, the power supply interconnects 75a and 75b for supplying the VDD provided at the ends, in the Y direction, of the set of the pad rows 30A to 30D in the configuration of FIG. 6 may be replaced with power supply interconnects for supplying a different potential, e.g., VSS. Alternatively, the power supply interconnect may be provided only at either one of the ends, in the Y direction, of the set of the pad rows, or power supply interconnects for supplying different potentials may be respectively provided at the ends, in the Y direction, of the set of the pad rows.

In the device of FIG. 6, the two I/O cell rows 10A and 10B have been arranged. However, this is not limiting. For example, the configuration of the present embodiment may be applied to a device with a single I/O cell row, or three or more I/O cell rows. Further, in the embodiments described above, the pads 30 have been arranged in two rows in a staggered pattern in each of the I/O cell rows 10A and 10B. However, the number of pad rows is not limited thereto, and the pads are not necessarily arranged in a staggered pattern. The interval between the pad rows is not limited to that shown in FIG. 6.

In the above-described embodiments, each of the I/O cell rows 10A and 10B in an annular shape has been arranged along the periphery of the semiconductor integrated circuit device 1. However, this is not limiting, and the I/O cell rows 10A and 10B may be arranged along a portion of the periphery of the semiconductor integrated circuit device 1, for example. The configuration of the present embodiment is not necessarily applied to the whole I/O cell rows 10A and 10B, and may be applied to a portion of the I/O cell rows 10A and 10B.

The present disclosure can ensure sufficient power supply ability and ESD protection capability for an I/O cell row without increasing the area of the semiconductor integrated circuit, and therefore, is effective for downsizing a large-scale LSI inputting and outputting a large number of signals.

What is claimed is:

1. A semiconductor integrated circuit device, comprising:
    a first I/O cell row and a second I/O cell row each including a plurality of I/O cells arranged side by side in a first direction, the first and second I/O cell rows being adjacent to each other in a second direction perpendicular to the first direction;
    a first in-row power supply interconnect and a second in-row power supply interconnect extending in the first direction in a first interconnect layer, and provided in a region of the first I/O cell row and a region of the second I/O cell row, respectively, each of the first and second in-row power supply interconnects supplying a predetermined power supply potential, and the first interconnect layer being composed of a single sublayer or two or more sublayers;
    a first power supply interconnect extending in the first direction in a second interconnect layer which is located above the first interconnect layer and thicker than the single sublayer or a thickest one of the two or more sublayers of the first interconnect layer, and provided in a region between the first and second I/O cell rows, the first power supply interconnect supplying the predetermined power supply potential; and
    a second power supply interconnect connecting the first power supply interconnect to at least one of the first in-row power supply interconnect or the second in-row power supply interconnect.

2. The semiconductor integrated circuit device of claim 1, wherein
    the second power supply interconnect includes an interconnect extending linearly in the second direction and connecting the first power supply interconnect to both of the first and second in-row power supply interconnects.

3. The semiconductor integrated circuit device of claim 1, wherein
    the second power supply interconnect includes an interconnect having a bend.

4. The semiconductor integrated circuit device of claim 1, wherein
    the second power supply interconnect is formed in a third interconnect layer which is located above the first interconnect layer and below the second interconnect layer, and is thicker than the at least one sublayer of the first interconnect layer.

5. The semiconductor integrated circuit device of claim 4, wherein
    the second power supply interconnect has at least a portion formed in the third interconnect layer and in the second interconnect layer.

6. The semiconductor integrated circuit device of claim 1, further comprising
    a first pad and a second pad provided in the region of the first I/O cell row and the region of the second I/O cell row, respectively, the first and second pads serving as external connection pads supplying the predetermined power supply potential, wherein
    the first and second pads are arranged to oppose to each other in the second direction, and connected to the second power supply interconnect.

7. The semiconductor integrated circuit device of claim 1, wherein
    each of the I/O cells in the first and second I/O cell rows includes a high power supply voltage region and a low power supply voltage region which are separated from each other in the second direction, each of the I/O cells being arranged such that the high power supply voltage region is adjacent to the first power supply interconnect.

8. The semiconductor integrated circuit device of claim 1, wherein
    a signal interconnect extending in the second direction is provided between an adjacent pair of the I/O cells.

* * * * *